United States Patent
Gabriel et al.

(10) Patent No.: US 6,815,359 B2
(45) Date of Patent: Nov. 9, 2004

(54) PROCESS FOR IMPROVING THE ETCH STABILITY OF ULTRA-THIN PHOTORESIST

(75) Inventors: Calvin T. Gabriel, Cupertino, CA (US); Uzodinma Okoroanyanwu, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 483 days.

(21) Appl. No.: 09/819,552

(22) Filed: Mar. 28, 2001

(65) Prior Publication Data

US 2002/0142607 A1 Oct. 3, 2002

(51) Int. Cl.$^7$ ............................................. H01L 21/302
(52) U.S. Cl. ..................... 438/705; 438/706; 438/708; 438/709; 438/710; 438/725
(58) Field of Search ................................ 438/705, 706, 438/708, 709, 710, 725

(56) References Cited

U.S. PATENT DOCUMENTS

| | | |
|---|---|---|
| 3,997,367 A | 12/1976 | Yau |
| 4,394,211 A | 7/1983 | Uchiyama et al. .......... 156/628 |
| 4,446,222 A | 5/1984 | Kress ......................... 430/307 |

(List continued on next page.)

OTHER PUBLICATIONS

"Deep–UV Lithography", http://courses.nus.edu.sg/course/phyweets/Projects98/OPTICAL/deep.html.*
U.S. patent application Ser. No. 09/819,342, Shields et al., filed Mar. 28, 2001.
U.S. patent application Ser. No. 09/819,343, Gabriel et al., Mar. 28, 2001.
U.S. patent application Ser. No. 09/819,344, Okoroanyanwu et al., filed Mar. 28, 2001.
U.S. patent application Ser. No. 09/819,692, Okoroanyanwu et al., filed Mar. 28, 2001.
U.S. patent application Ser. No. 09/820,143, Okoroanyanwu et al., filed Mar. 28, 2001.
Livesay, W. R., "Large–area electron–beam source,", Journal of Vacuum Science & Technology B, vol. 11, No. 6, Nov./Dec. 1993, pp. 2304–2308, American Vacuum Society.
Yang, J. J. et al, "Electron Beam Processing for Spln–on Polymers and its Applications to Back–End–of–Line (BEOL) Integration," Materials Research Society Symposium Proceedings, vol. 511, 1998, pp. 49–55, Materials Research Society.
Ross et al, "Plasma Etch Characteristics of Electron Beam Processed Photoresist," The Society of Photo–Optical Instrumentation Engineers, vol. 2438, 1995, pp. 803–816, SPIE—The International Society for Optical Engineering.
Grün, Von A. E., "Lumineszenz–photometrische Messungen der Energieabsorption im Strahlungsfeld von Elektronenquellen Eindimensionaler Fall in Luft," Zeitschrift für Naturforschung, vol. 12a, 1957,pp. 89–95, Publisher: Zeitschrift für Naturforschung; full English Translation attached (11 pgs.).
Chiong K.G. et al. "Resist Contrast Enhancement in High Resolution Electron Beam Lithography", Journal of Vacuum Science and Technology: Part B, American Institute of Physics, New York, US, vol. 7, No. 6.
Patent Abstracts of Japan, vol 1999, No. 09, Jul. 30, 1999 & JP 097328 A (Toshiba Corp), Apr. 9, 1999 abstract.

*Primary Examiner*—Nadine G. Norton
*Assistant Examiner*—Binh X. Tran
(74) *Attorney, Agent, or Firm*—Foley & Lardner LLP

(57) ABSTRACT

An integrated circuit fabrication process is disclosed herein. The process includes exposing a photoresist layer to a plasma, and transforming the top surface and the side surfaces of the photoresist layer to form a hardened surface. The process further includes etching the substrate in accordance with the transformed feature, wherein an etch stability of the feature is increased by the hardened surface. The photoresist layer is provided at a thickness less than 0.25 μm, for use in deep ultraviolet lithography, or for use in extreme ultraviolet lithography.

23 Claims, 3 Drawing Sheets

U.S. PATENT DOCUMENTS

| | | | |
|---|---|---|---|
| 5,003,178 A | 3/1991 | Livesay | 250/492.3 |
| 5,242,864 A | 9/1993 | Fassberg et al. | 438/701 |
| 5,468,595 A | 11/1995 | Livesay | |
| 5,510,216 A | 4/1996 | Calabrese et al. | 430/16 |
| 5,747,803 A | 5/1998 | Doong | 250/307 |
| 5,783,366 A | 7/1998 | Chen et al. | 430/311 |
| 5,876,903 A * | 3/1999 | Ng et al. | 430/313 |
| 5,928,821 A | 7/1999 | Garrity et al. | 430/23 |
| 5,962,195 A | 10/1999 | Yen et al. | 430/316 |
| 5,965,461 A | 10/1999 | Yang et al. | 438/717 |
| 5,994,225 A | 11/1999 | Liu et al. | |
| 6,054,254 A * | 4/2000 | Sato et al. | 430/322 |
| 6,103,457 A | 8/2000 | Gabriel | 430/318 |
| 6,107,172 A | 8/2000 | Yang et al. | 438/585 |
| 6,110,837 A | 8/2000 | Linliu et al. | |
| 6,121,130 A | 9/2000 | Chua et al. | 438/623 |
| 6,143,666 A | 11/2000 | Lin et al. | 438/725 |
| 6,174,818 B1 | 1/2001 | Tao et al. | 438/733 |
| 6,197,687 B1 | 3/2001 | Buynoski | |
| 6,200,903 B1 | 3/2001 | Oh et al. | 438/705 |
| 6,207,583 B1 * | 3/2001 | Dunne et al. | 438/725 |
| 6,232,048 B1 | 5/2001 | Buynoski et al. | |
| 6,271,154 B1 * | 8/2001 | Shen et al. | 438/725 |
| 6,319,655 B1 * | 11/2001 | Wong et al. | 430/311 |
| 6,358,670 B1 | 3/2002 | Wong et al. | 430/296 |
| 6,395,447 B1 | 5/2002 | Ishii et al. | 430/191 |
| 6,420,097 B1 | 7/2002 | Pike et al. | 430/313 |
| 6,420,702 B1 | 7/2002 | Tripsas et al. | 250/310 |
| 6,444,381 B1 | 9/2002 | Singh et al. | 430/30 |
| 6,500,605 B1 * | 12/2002 | Mullee et al. | 430/329 |
| 6,589,709 B1 | 7/2003 | Okoroanyanwu et al. | 430/296 |

\* cited by examiner

PROCESS FOR IMPROVING THE ETCH STABILITY OF ULTRA-THIN PHOTORESIST

CROSS REFERENCE TO RELATED APPLICATIONS

The present application is related to U.S. application Ser. No. 09/819,692 by Okoroanyanwu et al., filed Mar. 28, 2001, entitled "PROCESS FOR PREVENTING DEFORMATION OF PATTERNED PHOTORESIST FEATURES BY ELECTRON BEAM STABILIZATION;" U.S. application Ser. No. 09/820,143 by Okoroanyanwu et al., filed Mar. 28, 2001, entitled "IMPROVING SEM INSPECTION AND ANALYSIS OF PATTERNED PHOTORESIST FEATURES;" U.S. application Ser. No. 09/819,344 by Okoroanyanwu et al., filed Mar. 28, 2001, entitled "PROCESS FOR REDUCING THE CRITICAL DIMENSIONS OF INTEGRATED CIRCUIT DEVICE FEATURES;" U.S. application Ser. No. 09/819,342, by Shields et al., filed Mar. 28, 2001, entitled "PROCESS FOR FORMING SUB-LITHOGRAPHIC PHOTORESIST FEATURES BY MODIFICATION OF THE PHOTORESIST SURFACE;" and U.S. application Ser. No. 09/819,343 by Gabriel et al., entitled "SELECTIVE PHOTORESIST HARDENING TO FACILITATE LATERAL TRIMMING," and all assigned to the Assignee of the present application.

FIELD OF THE INVENTION

The present invention relates generally to integrated circuit (IC) fabrication. More particularly, the present invention relates to a process for improving the etch stability of ultra-thin photoresist utilized in IC fabrication.

BACKGROUND OF THE INVENTION

The semiconductor or IC industry aims to manufacture integrated circuits (ICs) with higher and higher densities of devices on a smaller chip area to achieve greater functionality and to reduce manufacturing costs. This desire for large scale integration has led to a continued shrinking of circuit dimensions and device features. The ability to reduce the size of structures, such as, gate lengths in field-effect transistors and the width of conductive lines, is driven by lithographic performance.

With conventional lithography systems, radiation is provided through or reflected off a mask or reticle to form an image on a semiconductor wafer. Generally, the image is focused on the wafer to expose and pattern a layer of material, such as, photoresist material. In turn, the photoresist material is utilized to define doping regions, deposition regions, etching regions, or other structures associated with integrated circuits (ICs) to one or more layers of the semiconductor wafer. The photoresist material can also define conductive lines or conductive pads associated with metal layers of an integrated circuit. Further, the photoresist material can define isolation regions, transistor gates, or other transistor structures and elements.

Presently, lithography systems are typically configured to expose the photoresist material at a radiation having a wavelength of 248 nanometers (nm). However, because the resolution of features is, in part, proportional to the inverse of the exposure wavelength, it is desirable to pattern photoresist material using radiation at shorter exposure wavelengths (e.g., 193 nm, 157 nm, 126 nm, or 13.4 nm). Unfortunately, materials, equipment, and/or fabrication techniques suitable for 248 nm lithography do not provide similar results at the shorter exposure wavelengths. Moreover, few, if any, materials or processes tailored for use with shorter exposure wavelengths exist.

One of the problems associated with the use of organic-based photoresist materials conventionally used in 365 nm or 248 nm lithography is the high optical absorption per unit thickness at the shorter wavelength lithographic radiation. Conventional photoresist materials become increasingly opaque at the shorter wavelengths and the necessary photochemical change will not occur throughout the entire thickness of the photoresist material.

To overcome this drawback, a thinner layer of photoresist material is used for the shorter lithographic wavelengths. A standard or conventional thickness of photoresist material for 248 nm lithography is more than 0.5 $\mu$m. The 248 nm photoresist materials are typically based on phenolic polymers. For 193 nm lithography, 193 nm photoresist materials based on acrylite and/or alicyclic polymers may be provided at a thickness of 0.4 to 0.3 $\mu$m. For even shorter lithographic wavelengths or to further enhance 193 nm lithography, ultra-thin resists (UTRs) are used, which are conventional photoresist materials provided at a thickness of less than 0.25 $\mu$m.

A certain amount of photoresist material (e.g., vertical thickness) is typically consumed during IC fabrication processes, e.g., resist trimming and/or etch processes. Unfortunately, when a thinner layer of photoresist material is used, such as, photoresists in 193 nm application or ultra-thin photoresists, there may not be enough photoresist material remaining after consumption to maintain pattern integrity, survive subsequent processes, and/or with which to successfully transfer the pattern to underlying layers. In other words, thinner layers of photoresist material suffer from the disadvantage of low or insufficient etch stability.

Thus, there is a need for a process for effectively extending the use of conventional photoresist materials for shorter lithographic applications in the vacuum ultraviolet (VUV), deep ultraviolet (DUV), or extreme ultraviolet (EUV) wavelength range. There is a further need for a process for increasing the etch stability of photoresists used in 193 nm application or ultra-thin photoresists.

BRIEF SUMMARY OF THE INVENTION

One exemplary embodiment relates to a method of increasing an etch stability of a photoresist layer. The method includes providing the photoresist layer at a thickness less than 0.25 $\mu$m, for use in vacuum ultraviolet lithography, deep ultraviolet lithography, or extreme ultraviolet lithography. The method further includes exposing the photoresist layer to a plasma, and transforming the exposed surfaces to form a hardened shell. The photoresist layer includes exposed surfaces, and the hardened shell increases the etch stability of the photoresist layer.

Another exemplary embodiment relates to an integrated circuit fabrication process. The process includes patterning a feature on a photoresist layer disposed over a substrate. The feature is patterned in accordance with a pattern provided on a mask or reticle and a radiation at a deep ultraviolet or extreme ultraviolet lithographic wavelength. The process further includes developing the photoresist layer, and exposing the photoresist layer to a plasma. The process still further includes transforming the top surface and the side surfaces to form a hardened surface, and etching the substrate in accordance with the transformed feature. The patterned photoresist layer includes at least one feature having a top surface and side surfaces. The exposing step occurs after the developing step and before the etching step. An etch stability of the feature is a function of the hardened surface.

Still another exemplary embodiment relates to a feature patterned on a photoresist layer disposed over a semiconductor substrate. The feature includes exposed surfaces, and an untreated region enclosed by the exposed surfaces. The exposed surfaces are structurally denser than the untreated region due to at least one of a fluorination, an ion implantation, and an electron beam curing. The feature is lithographically patterned using at least one of a deep ultraviolet lithographic wavelength, a vacuum ultraviolet lithographic wavelength, and an extreme ultraviolet lithographic wavelength or has a vertical thickness less than approximately 0.25 $\mu$m.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
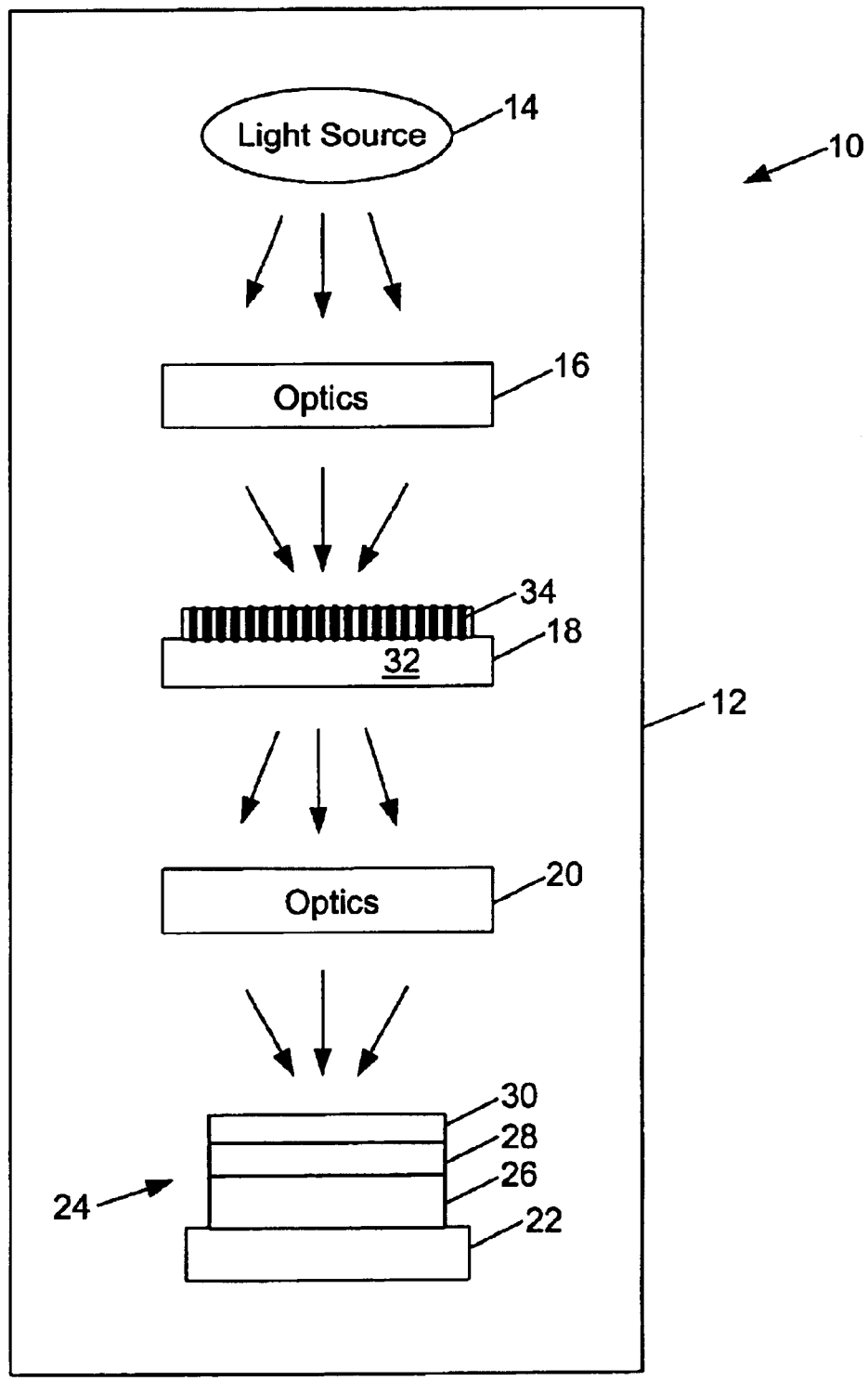
FIG. 1 is a general schematic block diagram of a lithographic system for patterning a wafer in accordance with an exemplary embodiment.

Referring to FIG. 1, there is shown a wafer 24 in a lithographic system 10. Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to wafer 24. Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 24 includes a substrate 26, a layer 28, and a photoresist layer 30. Photoresist layer 24 is disposed over layer 28, and layer 28 is disposed over substrate 26. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Layer 28 can be an insulative layer, a conductive layer, a barrier layer, or other layer of material to be etched, doped, or layered. In one embodiment, layer 28 can comprise one or more layers of materials, such as, a polysilicon stack comprised of a plurality of alternating layers of titanium silicide, tungsten silicide, cobalt silicide, etc. materials. In another embodiment, layer 28 is a hard mask layer, such as, a silicon nitride layer or a metal layer. The hard mask layer can serve as a patterned layer for processing substrate 26 or for processing a layer upon substrate 26. In yet another embodiment, layer 28 is an anti-reflective coating (ARC). Substrate 26 and layer 28 are not described in a limiting fashion, and can each comprise a conductive, semiconductive, or insulative material.

Photoresist layer 30 can comprise a variety of photoresist chemicals suitable for lithographic applications. Photoresist layer 30 is selected to have photochemical reactions in response to electromagnetic radiation emitted from light source 14. Materials comprising photoresist layer 30 can include, among others, a matrix material or resin, a sensitizer or inhibitor, and a solvent. Photoresist layer 30 is preferably a chemically amplified, positive or negative tone, organic-based photoresist. Photoresist layer 30 may be, but is not limited to, an acrylate-based polymer, an alicyclic-based polymer, or a phenolic-based polymer. For example, photoresist layer 30 may comprise PAR700 photoresist manufactured by Sumitomo Chemical Company.

Photoresist layer 30 is deposited, for example, by spin-coating over layer 28. The thickness of photoresist layer 30 is configured for use in vacuum ultraviolet lithography, deep ultraviolet lithography, and/or extreme ultraviolet lithography (e.g., 193 nm, 157 nm, 126 nm, or 13.4 nm lithography wavelength). Photoresist layer 30 is preferably provided at a thickness of approximately 0.25 $\mu$m or less, hereinafter also referred to as a ultra-thin photoresist.

Chamber 12 of lithographic system 10 can be a vacuum or low pressure chamber for use in vacuum ultraviolet (VUV) lithography. Chamber 12 can contain any of numerous types of atmospheres, such as, nitrogen, etc. Alternatively, lithographic system 10 can be utilized in various other types of lithography including lithography that uses electromagnetic radiation at any number of wavelengths.

Light source 14 provides light or electromagnetic radiation through condenser lens assembly 16, mask or reticle 18, and objective lens assembly to photoresist layer 30. Light source 14 is an excimer laser, in one embodiment, having a wavelength of 193 nm, 157 nm, or 126 nm, or a soft x-ray source at a wavelength of 13.4 nm. Alternatively, light source 14 may be a variety of other light sources capable of emitting radiation having a wavelength in the ultraviolet (UV), vacuum ultraviolet (VUV), deep ultraviolet (DUV), extreme ultraviolet (EUV), or x-ray range.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

Mask or reticle 18 is a binary mask in one embodiment. Mask or reticle 18 includes a translucent substrate 32 (e.g., glass or quartz) and an opaque or patterned layer 34 (e.g., chromium or chromium oxide) thereon. Opaque layer 34 provides a pattern or image associated with a desired circuit pattern, features, or devices to be projected onto photoresist layer 30. Alternatively, mask or reticle 18 may be an attenuating phase shift mask, an alternating phase shift mask, or other type of mask or reticle.

Figure 2:
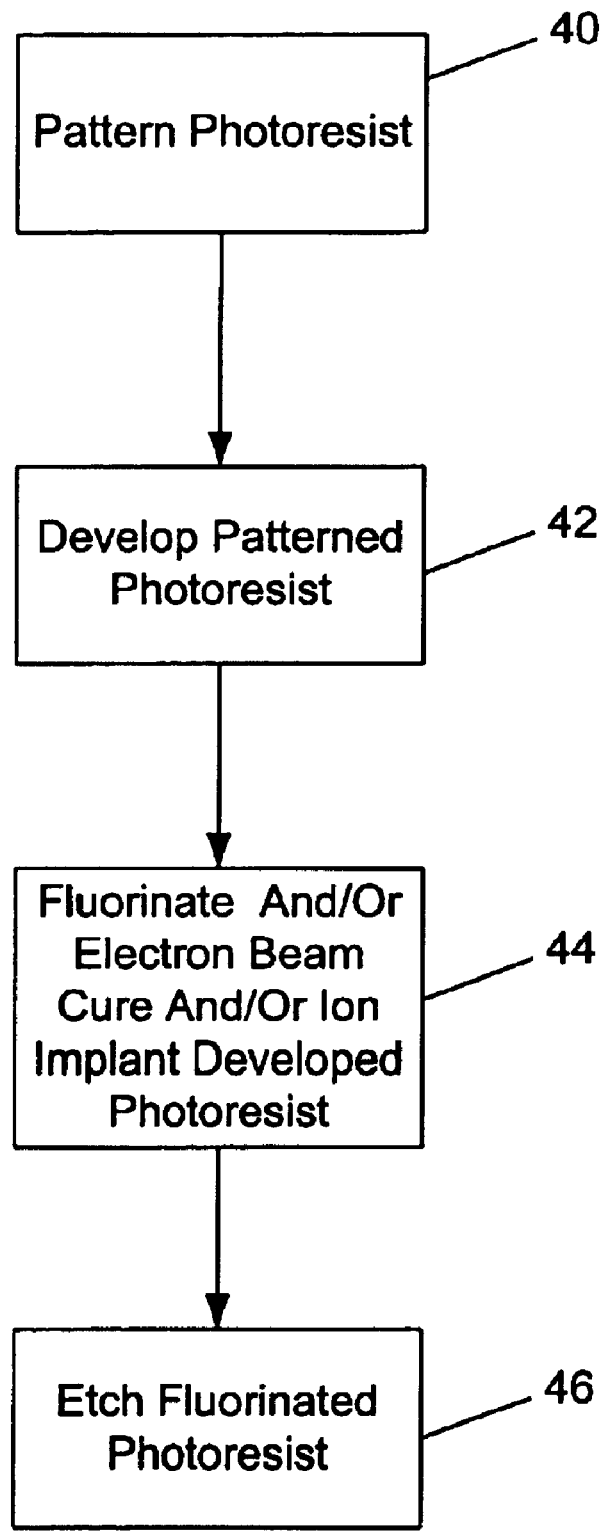
FIG. 2 is a flow diagram showing a process for increasing the etch stability of the photoresist layer in accordance with an exemplary embodiment.

An exemplary embodiment of the invention will be described with reference to a flow diagram shown in FIG. 2. The flow diagram includes a pattern photoresist step 40, a develop patterned photoresist step 42, a fluorination step 44, and an etch step 46.

Figure 3:
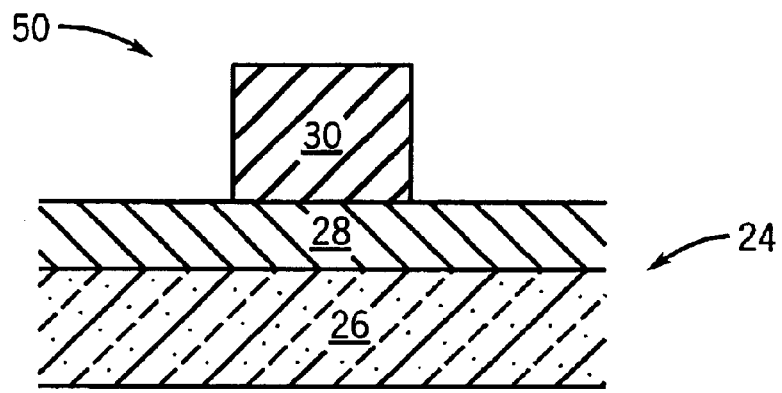
FIG. 3 is a cross-sectional view of the wafer, showing a development step.

Utilizing lithography system 10, the pattern or image provided on mask or reticle 18 is patterned on photoresist layer 30 in the pattern photoresist step 40. Next in step 42, wafer 24, including patterned photoresist layer 30, undergoes development to define features, such as, a feature 50, on photoresist layer 30 (FIG. 3). Feature 50 can define, but is not limited to, a conducting line, a transistor gate, a contact hole, a via, or a trench. The size and shape of feature 50 is not shown in a limiting fashion.

After the patterned photoresist layer 30 has been developed but before such a pattern is transferred onto any of the underlying layers, such as, layer 28, fluorination step 44 (or alternatively, an electron beam curing step or an ion implantation step) is performed on wafer 24. It should be understood that wafer 24 may be removed from chamber 12 and placed within a different chamber and/or a different environment which provides fluorination tools, such as, the Lam Research Corp. 4500 Model plasma etch system. Flood electron beam curing can be done in a tool, such as, the ElectronCure 1200-PR Model manufactured by Electron Vision Corporation. Alternatively, chamber 12 may be configured to include additional chambers and/or tools suitable to perform step 44.

Figure 4:
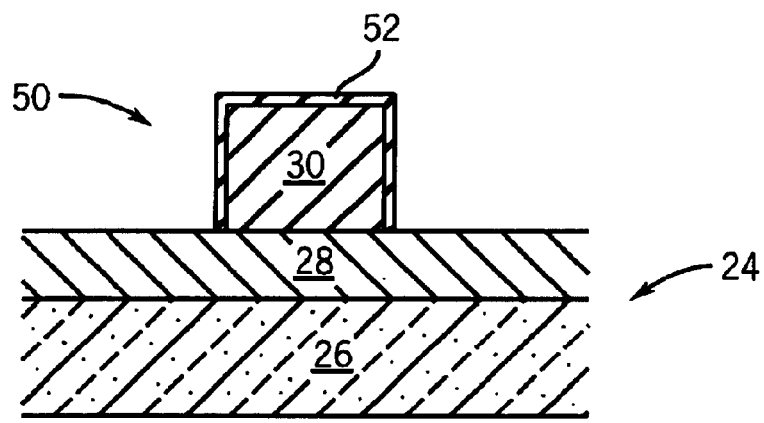
FIG. 4 is a cross-sectional view of the wafer illustrated in FIG. 3, showing a fluorination step.

Referring to FIG. 4, there is shown a cross-sectional view of a portion of wafer 24 undergoing fluorination step 42. Wafer 24 is exposed to a fluorine-based plasma (not shown) to modify the exposed surfaces of photoresist layer 30. Alternatively, wafer 24 may be exposed to a flood electron beam or ions. The exposed surfaces of photoresist layer 30, for example, a shell 52 comprising the top surface and side walls of feature 50, are chemically and structurally changed upon interaction with the fluorine-based plasma, electron beam, or implanted ions. The exposed surfaces are densified, becoming harder or structurally more rigid, and therefore more resistant to high-energy ions and/or reactive radicals present in the plasma processes that will be used to subsequently etch the layers of wafer 24 not covered by layer 30.

In one embodiment, the surface fluorination occurs utilizing $CF_4$ plasma at about 1000 sccm flow rate, 50 mTorr chamber pressure, 400 W radio frequency (RF) power, and 50° C. lower electrode temperature. Alternatively, the fluorine-based plasma may be other fluorocarbon chemistries, such as, $C_2F_6$, $CHF_3$, or $C_4F_8$, and including combination of gases possibly including additives, such as, inert gases, at operating parameters of 10–2000 sccm flow rate, 5–1000 mTorr chamber pressure, 50–2000 W RF power, and 20–80° C. lower electrode temperature.

Shell 52 has a thickness in the range of 20–500 Å relative to the initial thickness or height of feature 50. The extent of fluorination of the photoresist increases and shell 52 is thicker when fluorination process time is increased, or at higher plasma flow rates, moderate powers, higher chamber pressures, and/or lower electrode temperatures.

Fluorination step 44 causes a slight loss or reduction in the thickness of layer 30, typically in the range of a few Angstroms. However, the remaining thickness of layer 30, including the surface fluorinated feature 50, will have a much enhanced etch stability or etch resistance in comparison to its unfluorinated counterpart. In one embodiment, the etch stability is increased by approximately 20–50%. Etch stability is also referred to as hardness.

Figure 5:
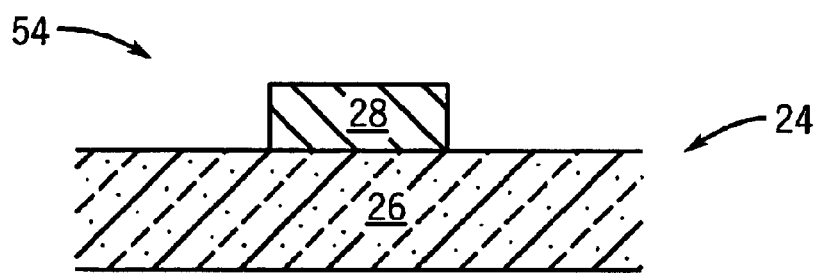
FIG. 5 is a cross-sectional view of the wafer illustrated in FIG. 4, showing an etch step.

Upon completion of fluorination step 44, pattern transfer to underlying layers, such as, layer 28, can occur using etch step 46. In one embodiment, etch step 46 comprises a dry etch using a plasma etchant, such as, $Cl_2/HBr$-based plasmas for etching silicon-based conductors, $Cl_2/BCl_3$-based plasmas for etching metals, $C_4F_8/O_2$-based plasmas for etching inorganic dielectrics, or $N_2/H_2$-based plasmas for etching organic dielectrics. As shown in FIG. 5, the increased etch stability of layer 30 permits features thereon, such as, feature 50, to maintain pattern integrity (i.e., survive etch step 46) to be effectively defined on layer 28. Accordingly, the benefit of the full resolving power of 193 nm exposures and/or the enhanced depth of focus provided by ultra-thin photoresist can be realized without introducing subsequent fabrication failure or errors due to insufficient photoresist thickness of ultra-thin photoresists.

It is contemplated that before or after fluorination step 44, wafer 24 may undergo other fabrication processes, such as, a resist trimming process, before etch step 46. It is also contemplated that shell 52 may be formed by an ion implantation step or by an electron beam exposure step in place of fluorination step 44. In the case of the ion implantation step, ions such as argon or fluorine may be utilized. Such ions would cause a certain depth of the exposed surfaces of layer 30 to densify, thereby making such areas less porous and making it harder for the etchant in etch step 46 to erode layer 30. In the case of the electron beam exposure step, a flood exposure electron beam of sufficient energy and dose will cause decarboxylation, cross-linking, and densification of the material comprising layer 30, again increasing the etch stability of layer 30 in subsequent processes.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Various modifications may be made in the details disclosed without departing from the spirit of the invention as defined in the following claims.

What is claimed is:

1. A method of increasing an etch stability of a photoresist layer, the method comprising the steps of:

providing the photoresist layer at a thickness less than 0.25 µm, for use in vacuum ultraviolet lithography, deep ultraviolet lithography, or extreme ultraviolet lithography;

exposing the photoresist layer to a plasma, the photoresist layer including exposed surfaces; and transforming the exposed surfaces to form a shell before using the photoresist layer to etch an underlying layer, wherein the shell increases the etch stability of the photoresist layer.

2. The method of claim 1, wherein the plasma has a plasma characteristic of approximately 50 mTorr chamber pressure.

3. The method of claim 2, wherein the plasma has plasma characteristics of approximately 100 sccm flow rate, 400 W radio frequency (RF) power, and 50° C. lower electrode temperature.

4. The method of claim 1, wherein the etch stability is increased by 20–50% as compared to the etch stability of the photoresist layer before exposure to the plasma.

5. The method of claim 1, wherein the transforming step includes transforming the exposed surfaces by a depth of up to approximately 50 nm.

6. The method of claim 1, wherein the transforming step includes at least one of decarboxylation, cross-linking, and densification of the exposed surfaces to form the shell, the shell being hardened.

7. An integrated circuit fabrication process, the process comprising:

patterning a feature on a photoresist layer disposed over a substrate, the feature patterned in accordance with a pattern provided on a mask or reticle and a radiation at a deep ultraviolet or extreme ultraviolet lithographic wavelength;

developing the photoresist layer, the patterned photoresist layer including at least one feature having a top surface and side surfaces;

exposing the photoresist layer to a fluorine-based plasma densifier;

transforming the top surface and the side surfaces with the densifier to form a hardened surface; and etching the substrate in accordance with the transformed feature, wherein the exposing step occurs after the developing step and before the etching step, and an etch stability of the feature is a function of the hardened surface.

8. The process of claim 7, further comprising providing the photoresist layer at a thickness of less than approximately 0.25 µm.

9. The process of claim 7, wherein the transforming step includes decarboxylation.

10. The process of claim 9, wherein the exposing step includes providing the fluorine-based plasma at operating parameters of 10–2000 sccm flow rate, 5–1000 mTorr chamber pressure, 50–2000 WRF power, and 20–80° C. lower electrode temperature.

11. The process of claim 7, wherein the densifier is a flood electron beam.

12. The process of claim 7, wherein the densifier is an ion implantation.

13. The process of claim 7, wherein the hardened surface has a depth of 2–50 nm.

14. The process of claim 7, wherein the transforming step includes at least one of decarboxylation cross-linking, and densification of the top surface and the side surfaces to form the hardened surface.

15. An integrated circuit fabrication process, the process comprising:

patterned a feature on a photoresist layer disposed over a substrate, the feature patterned in accordance with a pattern provide on a mask or reticle and a radiation at a deep ultraviolet or extreme ultraviolet lithographic wavelength;

developing the photoresist layer, the patterned photoresist layer including at least one feature having a top surface and side surfaces;

exposing the photoresist layer to a fluorine-based or argons densifier;

transforming the top surface and the side surfaces with the densifier to form a hardened surface; and etching the substrate in accordance with the transformed feature, wherein the exposing step occurs after the developing step and before the etching step, and an etch stability of the feature is a function of the hardened surface, wherein the transforming step includes fluorinating the top surface and the side surfaces.

16. A method of using a feature on a photoresist layer disposed above a layer or substrate, the feature including exposed surfaces, the feature being lithographically patterned using at least one of a deep ultraviolet lithographic wavelength, a vacuum ultraviolet lithographic wavelength, and an extreme ultraviolet lithographic wavelength or has a vertical thickness less than approximately 0.25 µm, and the method comprising:

transforming the exposed surfaces to be structurally denser than the untreated region due to at least one of a fluorination, a fluorine ion implantation and argon ion implantation; and etching or doping the layer or substrate according to the feature, wherein the exposed surfaces are structurally denser due to the fluorination, the fluorination including the feature being exposed to a fluorine-based plasma.

17. The method of claim 16, wherein a depth of the exposed surfaces is in the range of 2–50 nm.

18. The method of claim 16, wherein the exposed surfaces comprise a top surface and side surfaces of the feature.

19. The method of claim 16, wherein the transforming step includes cross-linking.

20. The method of claim 16, wherein the fluorine-based plasma has operating parameters of 10–2000 sccm flow rate, 5–1000 mTorr chamber pressure, 50–2000 W RF power, and 20–80° C. lower electrode temperature.

21. The feature of claim 16, wherein the material comprising the photoresist layer is an organic-based photoresist material based on at least one of phenolic polymers, acrylate polymers, and alicyclic polymers.

22. The method of claim 16, wherein the photoresist layer comprises an acrylate or alicyclic polymer and the feature is lithographically patterned using a 193 nm wavelength of radiation.

23. The method of claim 16, wherein the feature is at least one of a conducting line, a gate for a transistor device, a contact hole, a via structure, or a trench.

* * * * *

UNITED STATES PATENT AND TRADEMARK OFFICE
CERTIFICATE OF CORRECTION

PATENT NO. : 6,815,359 B2
DATED : November 9, 2004
INVENTOR(S) : Calvin T. Gabriel and Uzodinma Okoroanyanwu It is certified that error appears in the above-identified patent and that said Letters Patent is hereby corrected as shown below:

Column 6,
Line 44, following "plasma" insert -- including fluorine --.

Column 7,
Line 28, delete "WRF" and substitute -- W RF --.
Line 42, preceding "a feature" delete "patterned" and substitute -- patterning --.

Column 8,
Line 2, preceding "densifier", delete "argons" and substitute -- argon --.

Signed and Sealed this

Eighth Day of February, 2005

JON W. DUDAS
*Director of the United States Patent and Trademark Office*